(12) United States Patent
Shimamoto et al.

(10) Patent No.: US 10,090,322 B2
(45) Date of Patent: Oct. 2, 2018

(54) METHOD OF MANUFACTURING SEMICONDUCTOR DEVICE

(71) Applicant: HITACHI KOKUSAI ELECTRIC INC., Tokyo (JP)

(72) Inventors: Satoshi Shimamoto, Toyama (JP); Toshiyuki Kikuchi, Toyama (JP); Atsushi Moriya, Toyama (JP); Masanori Nakayama, Toyama (JP); Takashi Nakagawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/462,066

(22) Filed: Mar. 17, 2017

(65) Prior Publication Data

US 2018/0197877 A1    Jul. 12, 2018

(30) Foreign Application Priority Data

Jan. 11, 2017    (JP) .................................. 2017-002537

(51) Int. Cl.
*H01L 27/115*    (2017.01)
*H01L 27/11582*    (2017.01)
(Continued)

(52) U.S. Cl.
CPC .... *H01L 27/11582* (2013.01); *H01L 21/0262* (2013.01); *H01L 21/02532* (2013.01);
(Continued)

(58) Field of Classification Search
CPC ........................... H01L 27/11582; H01L 22/12
See application file for complete search history.

(56) References Cited

U.S. PATENT DOCUMENTS

2012/0098050 A1    4/2012 Shim et al.
2014/0035026 A1    2/2014 Jang et al.
(Continued)

FOREIGN PATENT DOCUMENTS

JP    2014-033201 A    2/2014
JP    2014-057067 A    3/2014
(Continued)

OTHER PUBLICATIONS

The Taiwanese Office Action dated Dec. 11, 2017 for the Taiwanese Application No. 106108714.
(Continued)

*Primary Examiner* — Tom Thomas
*Assistant Examiner* — Nilufa Rahim
(74) *Attorney, Agent, or Firm* — Volpe and Koenig, P.C.

(57) ABSTRACT

A method of manufacturing a semiconductor device, includes: loading a substrate including a laminated film including an insulating film and a sacrificial film, a channel hole formed in the laminated film, a charge trapping film formed on a surface in the channel hole, a first channel film formed on a surface of the charge trapping film, and a common source line exposed on the bottom of the channel hole; receiving information on a distribution of hole diameter of the channel hole; and forming a second channel film on a surface of the first channel film by supplying a first processing gas and a second processing gas to a center side and an outer peripheral side of the substrate, respectively, so as to correct the distribution of the hole diameter based on the information.

8 Claims, 14 Drawing Sheets

(51) Int. Cl.
  *H01L 27/1157* (2017.01)
  *H01L 21/66* (2006.01)
  *H01L 21/28* (2006.01)
  *H01L 21/02* (2006.01)

(52) U.S. Cl.
  CPC ........ *H01L 21/28282* (2013.01); *H01L 22/12* (2013.01); *H01L 27/1157* (2013.01)

(56) References Cited

U.S. PATENT DOCUMENTS

| | | |
|---|---|---|
| 2014/0070302 A1 | 3/2014 | Yoo et al. |
| 2014/0073099 A1 | 3/2014 | Park et al. |
| 2015/0060992 A1 | 3/2015 | Taekyung et al. |
| 2015/0206806 A1 | 7/2015 | Leem et al. |
| 2016/0141173 A1 | 5/2016 | Moriya et al. |
| 2016/0379798 A1 | 12/2016 | Shishido et al. |
| 2017/0025437 A1* | 1/2017 | Walker .............. H01L 27/11582 |

FOREIGN PATENT DOCUMENTS

| | | |
|---|---|---|
| JP | 2014-057068 A | 3/2014 |
| JP | 2015-050466 A | 3/2015 |
| JP | 2015-106530 A | 6/2015 |
| JP | 5837796 B2 | 12/2015 |
| JP | 2016-105457 A | 6/2016 |
| KR | 20150085956 A | 7/2015 |
| TW | 201229294 A1 | 7/2012 |
| TW | 201513314 A | 4/2015 |

OTHER PUBLICATIONS

Korean Office Action dated Mar. 31, 2018 for the Korean Patent Application No. 10-2017-0031225.

* cited by examiner

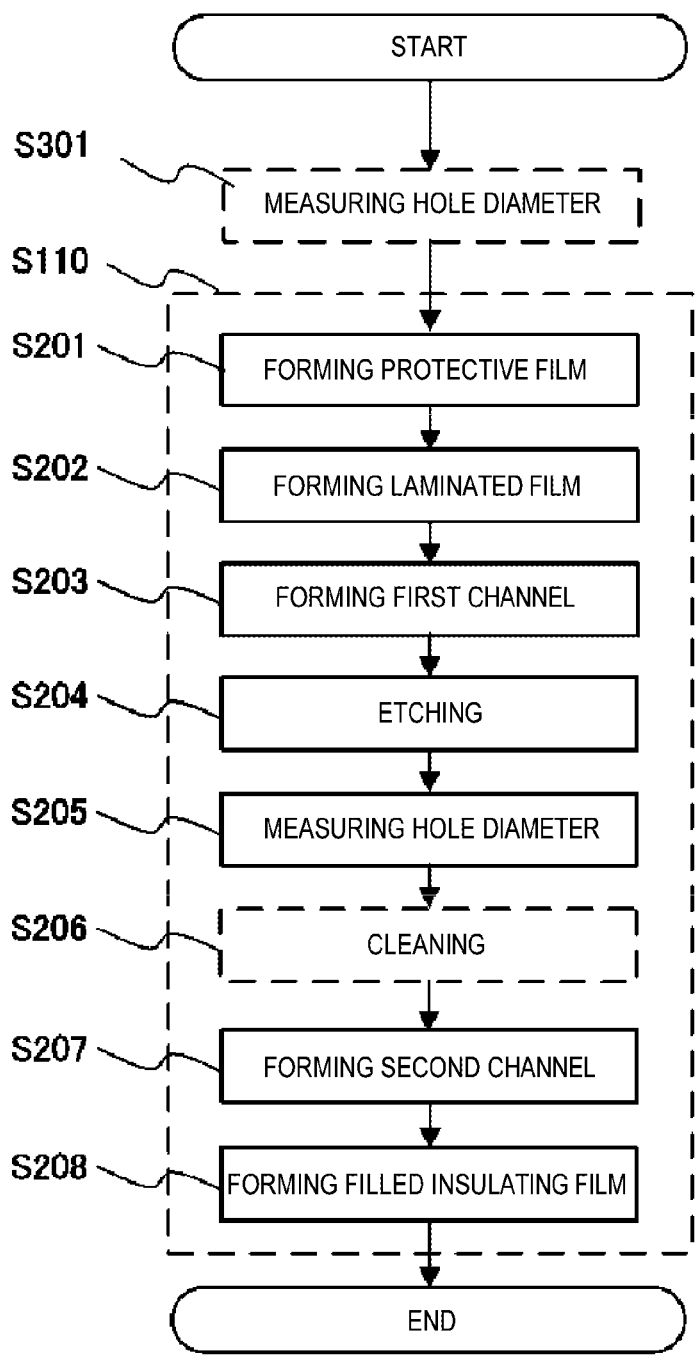

STATE AFTER PROTECTIVE FILM FORMING STEP S201

STATE AFTER LAMINATED FILM FORMING STEP S202

STATE AFTER FIRST CHANNEL FORMING STEP S203

STATE AFTER ETCHING STEP S204

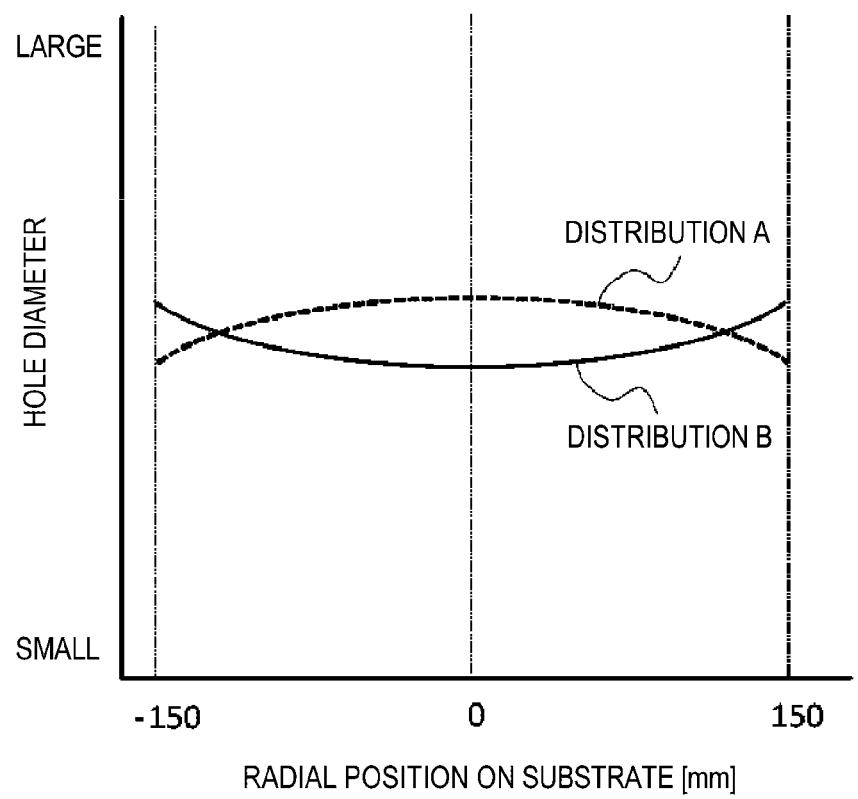

STATE AFTER SECOND CHANNEL FORMING STEP S207

STATE AFTER FILLED INSULATING FILM FORMING STEP S208

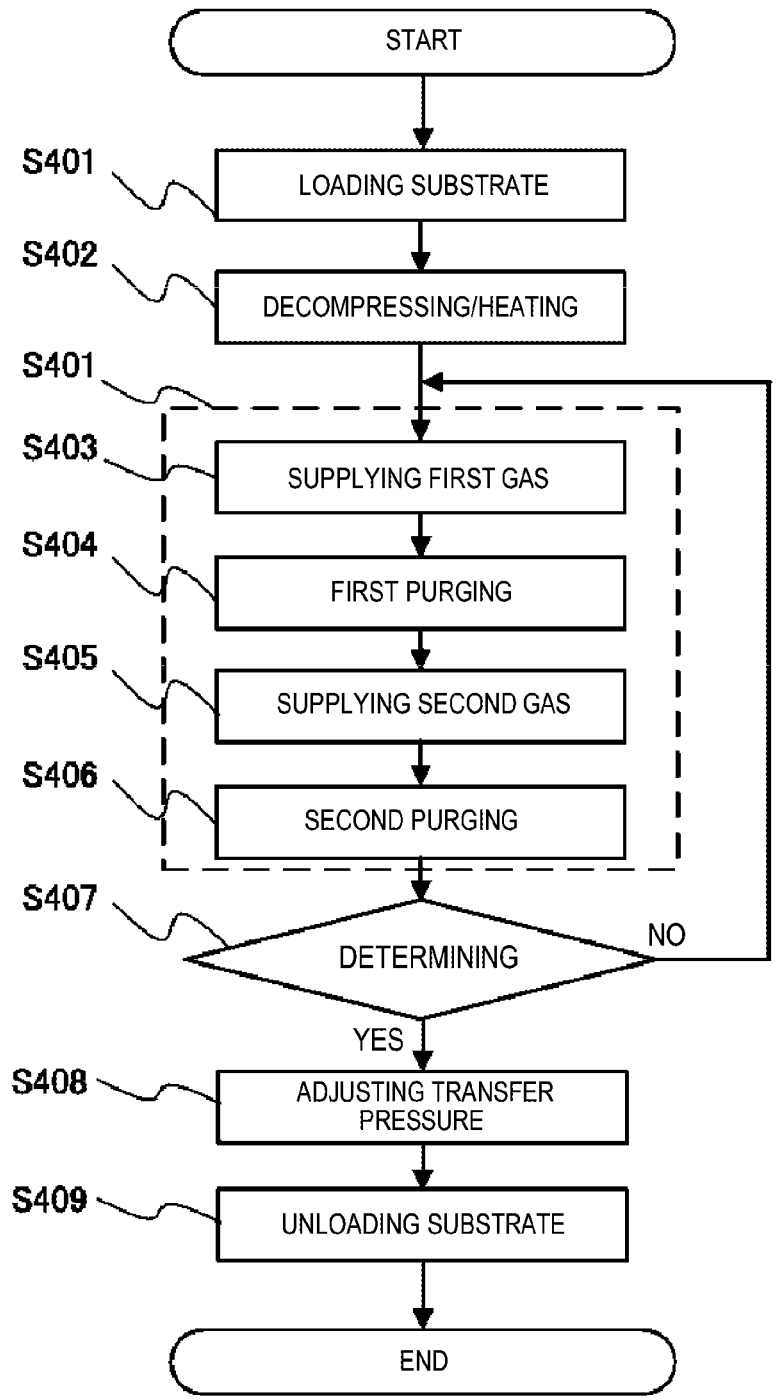

STATE AFTER SACRIFICIAL FILM REMOVING STEP S112

STATE AFTER CONDUCTIVE FILM FORMING STEP S114

METHOD OF MANUFACTURING SEMICONDUCTOR DEVICE

CROSS-REFERENCE TO RELATED APPLICATION

This application is based upon and claims the benefit of priority from Japanese Patent Application No. 2017-002537, filed on Jan. 1, 2017, the entire contents of which are incorporated herein by reference.

TECHNICAL FIELD

The present disclosure relates to a method of manufacturing a semiconductor device.

BACKGROUND

In recent years, semiconductor devices have a tendency toward high integration. As one method for realizing this high integration, there has been proposed a three-dimensional structure in which electrodes or the like are three-dimensionally arranged.

In a process of forming a three-dimensional structure of a semiconductor device such as a flash memory, it is necessary to laminate an insulating film and a sacrificial film alternately. However, due to a difference in thermal expansion coefficient between the insulating film and the sacrificial film or the like, a stress may be applied to a silicon wafer and the laminated film may be destroyed in the forming process, which may lead to deterioration of the characteristics of the semiconductor device.

SUMMARY

The present disclosure provides some embodiments of a technique capable of forming a semiconductor device with good characteristics even in a flash memory having a three-dimensional structure.

According to an embodiment of the present disclosure, a technique is provided which includes: loading a substrate including a laminated film including an insulating film and a sacrificial film, a channel hole formed in the laminated film, a charge trapping film formed on a surface in the channel hole, a first channel film formed on a surface of the charge trapping film, and a common source line exposed on the bottom of the channel hole; receiving information on a distribution of hole diameter of the channel hole; and forming a second channel film on a surface of the first channel film by supplying a first processing gas and a second processing gas to a center side and an outer peripheral side of the substrate, respectively, so as to correct the distribution of the hole diameter based on the information.

BRIEF DESCRIPTION OF THE DRAWINGS

FIG. 4 is an explanatory view for explaining a flow of manufacturing a semiconductor device according to the first embodiment.

FIG. 7 illustrates an example of distributions of hole diameter of a channel hole according to the first embodiment.

FIG. 13 is an explanatory view for explaining a flow of manufacturing a semiconductor device according to the first embodiment.

DETAILED DESCRIPTION

First Embodiment

A first embodiment of the present disclosure will now be described.

Figure 1:
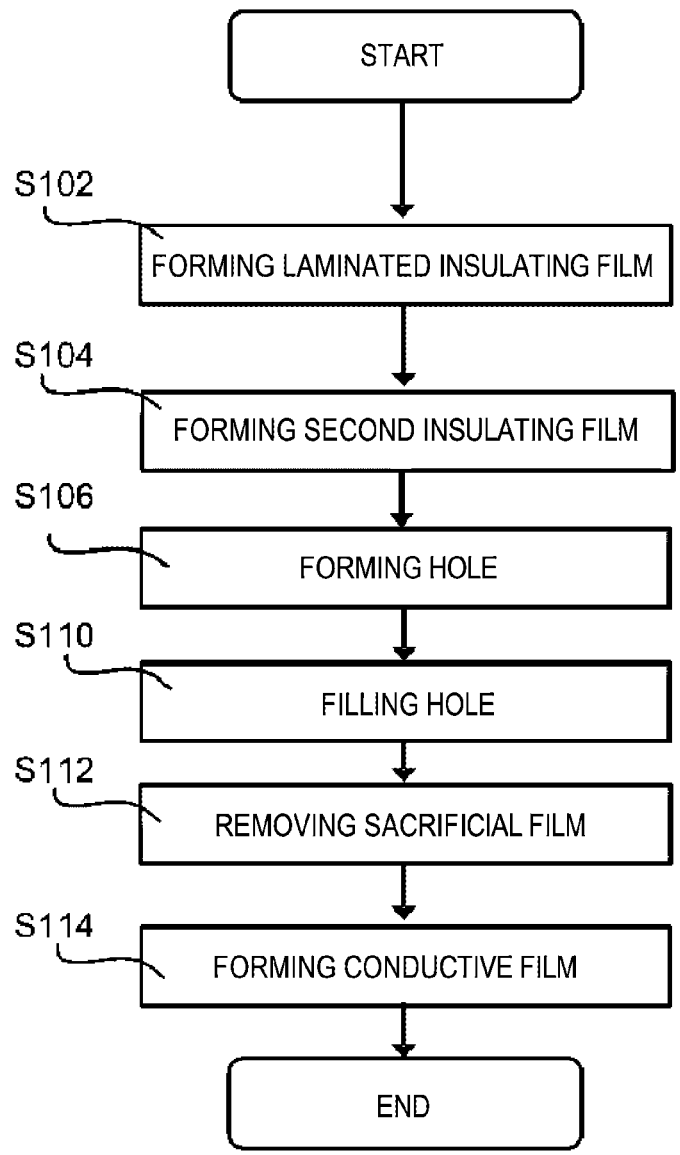
FIG. 1 is an explanatory view for explaining a flow of manufacturing a semiconductor device according to a first embodiment of the present disclosure.
Figure 14A:
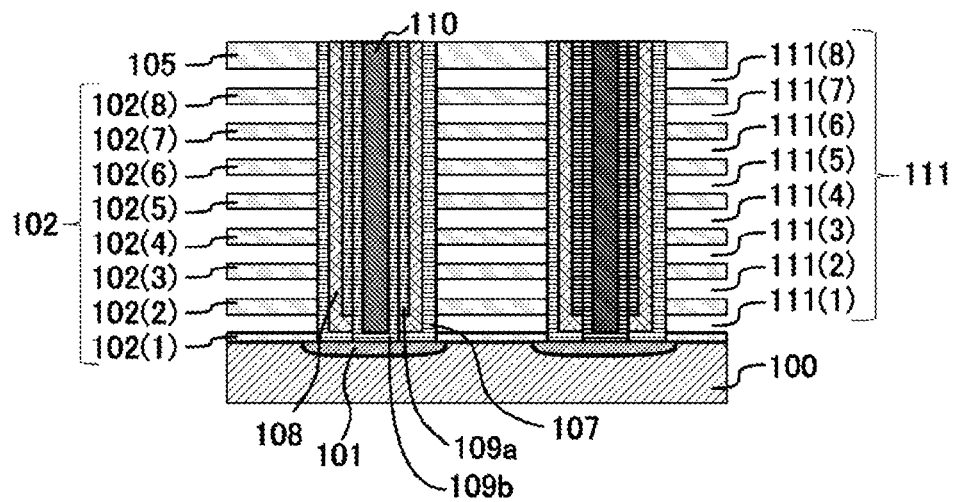
FIGS. 14A and 14B are explanatory views for explaining a state of processing a wafer according to the first embodiment.
Figure 14B:
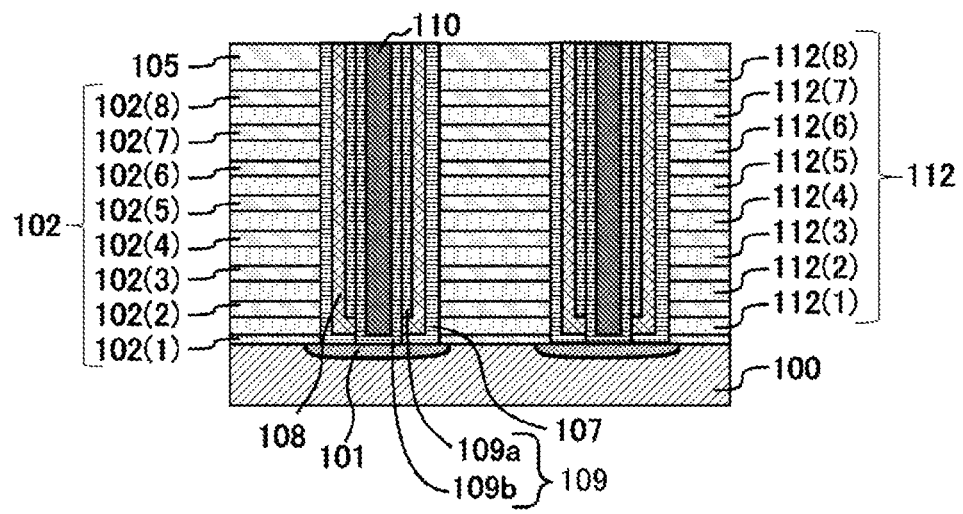

A process of manufacturing a semiconductor device will be described with reference to FIG. 1. In this process, a semiconductor device having a three-dimensional structure including three-dimensional electrodes is formed. As shown in FIG. 14B, this semiconductor device has a laminated structure including an insulating film 102 and a conductive film 112 alternately laminated on a wafer 100. A specific flow will be described below.

[S102]

A laminated insulating film forming step S102 will be described with reference to FIG. 2 which is a view for explaining laminated insulating films 102 and 103 formed on a semiconductor wafer (wafer) 100 as a substrate. A common source line (CSL) 101 is formed in the wafer 100. The insulating film 102 is also referred to as a first insulating film.

In this step, an insulating film 102 and a sacrificial film 103 are laminated on the wafer 100. The insulating film 102 is made of a silicon oxide (SiO) film. The SiO film is formed by heating the wafer 100 to a predetermined temperature and supplying a silicon-containing gas consisting mainly of a silicon component and an oxygen-containing gas consisting mainly of an oxygen component onto the wafer 100.

The sacrificial film 103 is removed in a sacrificial film removing step S112 to be described later and has etching selectivity to the insulating film 102. Having etching selectivity means that, when exposed to an etching solution, the sacrificial film is etched and the insulating film is not etched. The sacrificial film 103 is composed of, for example, a silicon nitride (SiN) film. The SiN film is formed by heating the wafer 100 to a predetermined temperature and supplying a silicon-containing gas consisting mainly of a silicon component and a nitrogen-containing gas consisting mainly of a nitrogen component onto the wafer 100.

Figure 2:
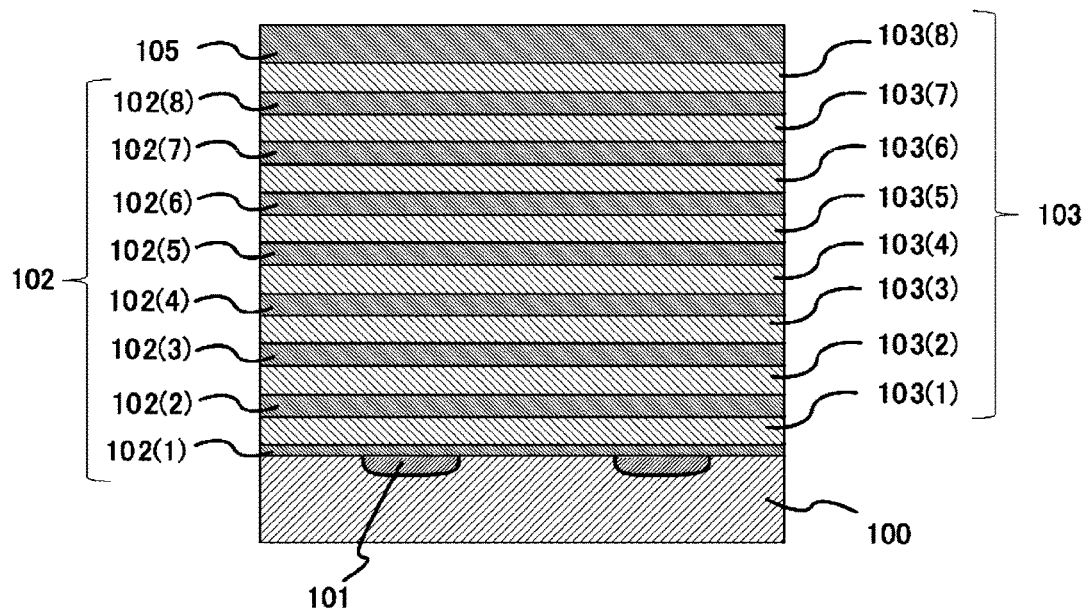
FIG. 2 is an explanatory view for explaining a state of processing a wafer according to the first embodiment.

The laminated insulating films 102 and 103 shown in FIG. 2 are formed by alternately forming an insulating film 102(m) and a sacrificial film 103(n) a predetermined number of times. In this embodiment, eight insulating films 102 (insulating film 102(1) . . . , insulating film 102(m) . . . , insulating film 102(8)) and eight sacrificial films 103 (sacrificial film 103(1) . . . , sacrificial film 103(n) . . . , sacrificial film 103(8)) are alternately formed. In other words, the insulating film 102(1), the insulating film 102(2), the insulating film 102(3), . . . , the insulating film 102(8) are formed in order from the bottom. The sacrificial film 103(1), the sacrificial film 103(2), . . . , the sacrificial film 103(8) are formed in order from the bottom. Although it is shown in FIG. 2 that the eight insulating films 102 and the eight sacrificial films 103 are formed, the number of films is not limited thereto but may be increased to 16, 32, 48, 64, 72, . . . .

[S104]

Next, a second insulating film forming step S104 will be described. In this step, a second insulating film (also referred simply to as an insulating film) 105 shown in FIG. 2 is formed. The second insulating film 105 is formed by the same method as the insulating film 102 and is formed on the sacrificial film 103.

[S106]

Figure 3A:
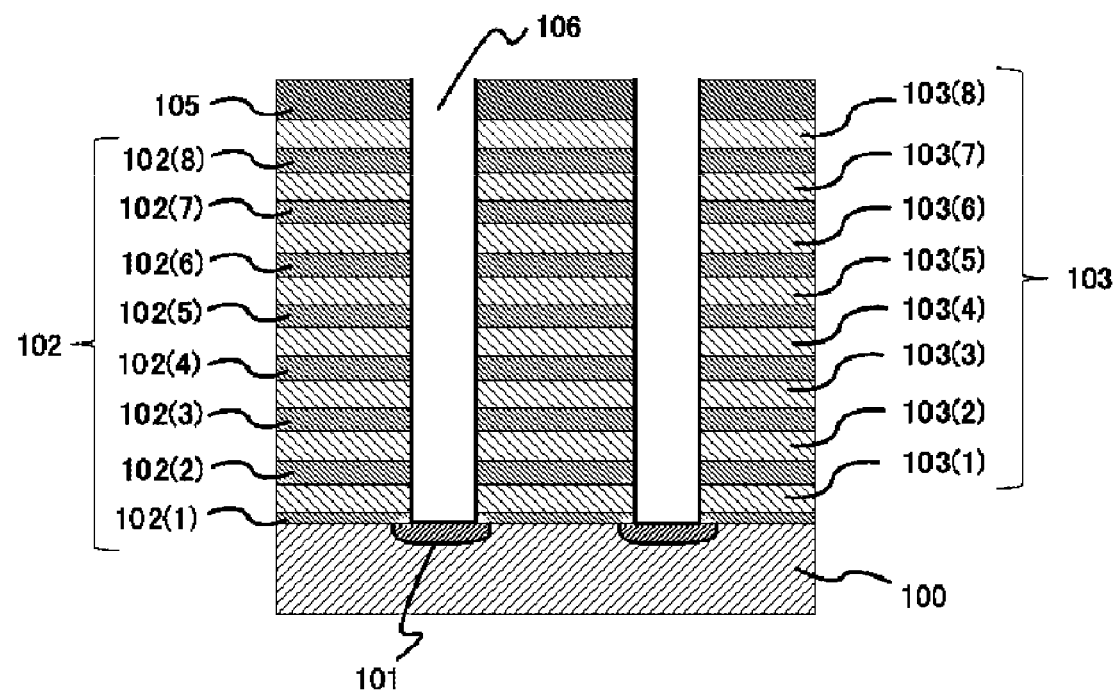
FIGS. 3A and 3B are explanatory views for explaining a state of processing a wafer according to the first embodiment.
Figure 3B:
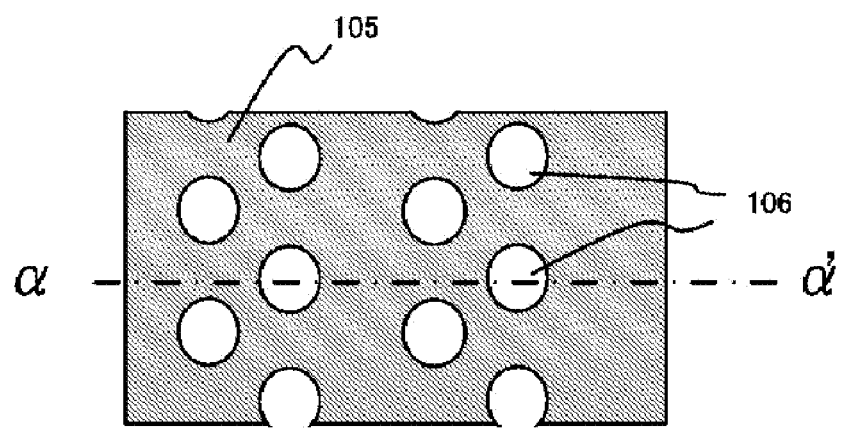

Next, a hole forming step S106 will be described with reference to FIG. 3A which is side view similar to FIG. 2 and FIG. 3B which is a top view of the configuration of FIG. 3A. The sectional view taken along line α-α' in FIG. 3B corresponds to FIG. 3A.

In this step, dry etching is performed on the laminated structure of the insulating films 102 and 105 and the sacrificial film 103 to form a channel hole 106. As shown in FIG. 3A, the channel hole 106 is formed so as to expose the CSL 101. As shown in FIG. 3B, a plurality of channel holes 106 is formed in the surface of the insulating film 105.

[S110]

A hole filling step S110 will be described with reference to FIGS. 4, 5A, 5B, 6A, 6B, 8A and 8B. The scales of FIGS. 5A, 5B, 6A, 6B, 8A and 8B are different from those of FIGS. 3A and 3B for convenience of explanation. This step S110 is a step of filling the channel hole 106, which is formed in the hole forming step S106, with a charge trapping film 108 or the like. In the hole filling step S110 includes a protective film forming step S201, a laminated film forming step S202, a first channel forming step S203, an etching step S204, a hole diameter measuring step S205, a cleaning step S206, a second channel forming step S207 and a filling insulating film forming step S208 which are performed in order. FIGS. 5A, 5B, 6A, 6B, 8A and 8B show states of the wafer 100 obtained after these steps S201 to S208 are performed.

(Protective Film Forming Step S201)

Figure 5A:
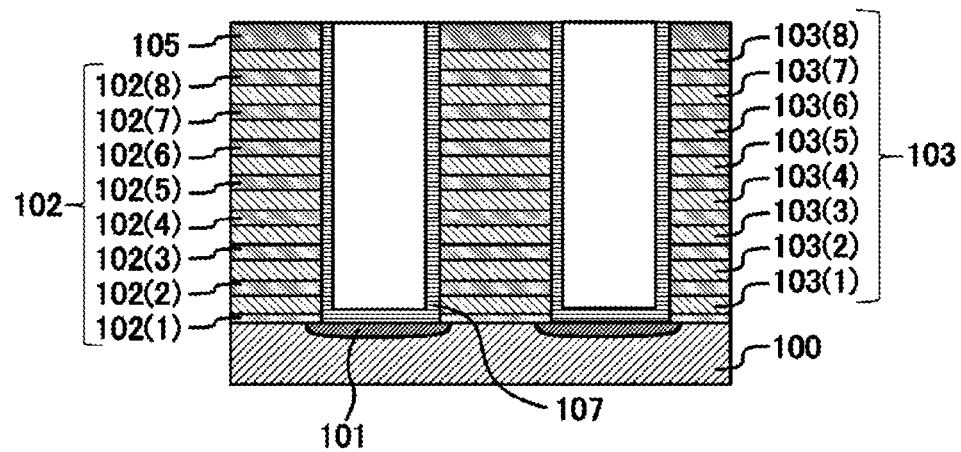
FIGS. 5A and 5B are explanatory views for explaining a state of processing a wafer according to the first embodiment.

In the protective film forming step S201, as shown in FIG. 5A, a protective film 107 is formed on the inner wall surface of the channel hole 106. The protective film 107 is used to prevent the charge trapping film 108 from being damaged when removing the sacrificial film 103 in a later step. The protective film 107 is formed of, for example, a SiO film or a metal oxide film.

(Laminated Film Forming Step S202)

Figure 5B:
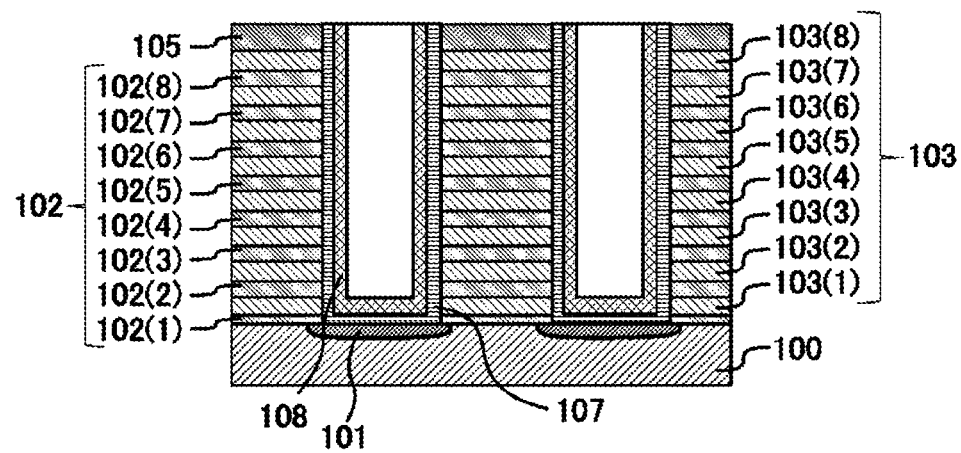

In the laminated film forming step S202, as shown in FIG. 5B, the charge trapping film [a laminate of (inter-gate electrode insulating film-charge trapping film-tunnel insulating film)] 108 is formed on the inner wall surface of the channel hole 106 on which the protective film 107 is formed.

The charge trapping film 108 is formed of a laminated film of SiO—SiN—SiO. Although a silicon-based film is exemplified here, the present disclosure is not limited thereto but a transition metal-based film may be used to increase the amount of charges.

(First Channel Forming Step S203)

Figure 6A:
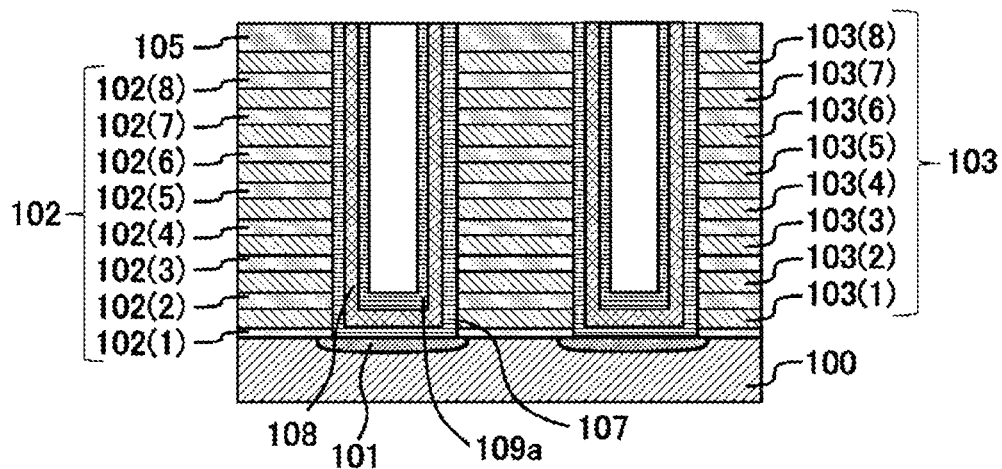
FIGS. 6A and 6B are explanatory views for explaining a state of processing a wafer according to the first embodiment.

In the first channel forming step S203, as shown in FIG. 6A, a first channel film 109a is formed on the inner wall surface of the channel hole 106 on which the charge trapping film 108 and the protective film 107 are formed. The first channel film 109a is formed of a polysilicon film.

(Etching Step S204)

Figure 6B:
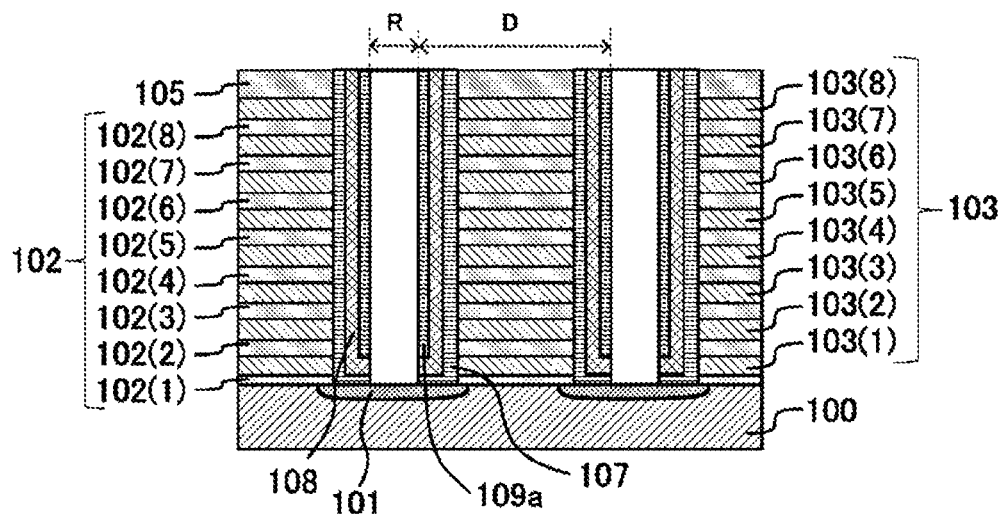

In the etching step S204, as shown in FIG. 6B, the side portions of the channel hole 106 on which the first channel film 109a, the charge trapping film 108 and the protective film 107 are formed are etched to expose the CSL in the bottom of the channel hole 106.

By performing these above-described steps, the protective film 107, the charge trapping film [(the laminate of (inter-gate electrode insulating film-charge trapping film-tunnel insulating film)] 108 and the first channel film 109a are formed in order from the outer circumference side of the channel hole 106. Each of these films is formed in a tubular or cylindrical shape.

By the way, the present inventors have found that the semiconductor device formed by such a process has different characteristics depending on the location of the wafer 100. Results of careful examination on this problem showed that distributions of hole diameter R (depicted in FIG. 6B) on the surface of the wafer 100 occurred in the wafer 100 after the etching step S204. For example, the distributions of hole diameter may be exhibited as shown in FIG. 7. Specifically, there may be a distribution A and a distribution B. In the distribution A, the hole diameter on the center side of the wafer 100 is larger than the hole diameter on the outer peripheral side thereof. In the distribution B, the hole diameter on the center side of the wafer 100 is smaller than the hole diameter on the outer peripheral side thereof. With such distributions of the hole diameter, the film thickness of the channel film 109 including the first channel film 109a and the second channel film 109b formed on the wafer 100 differs on the surface of the wafer 100. The film thickness of the channel film 109 has a proportional relationship with its resistance value. Therefore, there is a problem that the characteristics of the semiconductor device become uneven due to a difference in resistance. In particular, when the thickness T of the side wall of the channel film 109 changes, a channel resistance varies. As a result, a channel current varies and, accordingly, the thickness T affects the amount of write of charges in the charge trapping film 108 corresponding to each layer of the conductive film 112. Therefore, it is necessary to make the film thickness T of the channel film 109 uniform within the plane of the wafer 100. The inventors found the following hole diameter measuring step S205, cleaning step S206 and second channel forming step S207 to improve such non-uniformity of the channel film 109.

Hereinafter, a process and apparatus for correcting the film thickness of the channel film 109 after the etching step S204 will be described with reference to FIGS. 4, 9, 10, 11 and 12. FIG. 4 is a flowchart of a process of reducing the resistance non-uniformity of the channel film 109. FIGS. 9 to 12 are views illustrating the configuration of a substrate processing apparatus capable of correcting a film thickness distribution of the second channel film 109b.

First, the hole diameter measuring step S205 is performed. The cleaning step S206 may be omitted.

(Hole Diameter Measuring Step S205)

First, after the etching step S204, the hole diameter measuring step S205 is performed on the wafer 100 having an in-plane distribution of hole diameter.

First, the hole diameter measuring step S205 is performed to measure a distribution of hole diameter of the channel hole 106. The hole diameter of the channel hole 106 is measured with, e.g., a SEM (Scanning Electron Microscope) apparatus (not shown) or a measuring apparatus (not shown) using BSE (Back Scattered Electron). Data of the measured hole diameter are transmitted to a host device 270, or a receiving part 283 of a controller 280 shown in FIGS. 9 and 12.

(Cleaning Step S206)

The cleaning step S206 may be performed on the wafer 100 after the etching step S204 and the hole diameter measuring step S205 are completed. The cleaning step S206 can be performed to suppress occurrence of defects in the semiconductor device, but details of which will not be described for the sake of brevity.

Next, a substrate processing apparatus 900 that performs the second channel forming step S207 will be described with reference to FIGS. 9, 10, 11 and 12.

(Substrate Processing Apparatus)

The substrate processing apparatus 900 includes a processing container 202. The processing container 202 is, for example, a closed container having a circular flat cross section. A processing chamber 201 for processing a wafer 100 such as a silicon wafer as a substrate and a transfer chamber 203 are formed in the processing container 202. The processing container 202 is composed of an upper container 202a and a lower container 202b. A partition plate 204 is installed between the upper container 202a and the lower container 202b. A room forming a space surrounded by the upper container 202a above the partition plate 204 is referred to as the processing chamber 201, and a space surrounded by the lower container 202b below the partition plate 204 is referred to as the transfer chamber 203.

A substrate loading/unloading port 206 adjacent to a gate valve 205 is installed in the side surface of the lower container 202b. The wafer 100 is moved between the transfer chamber 203 and a vacuum transfer chamber (not shown) via the substrate loading/unloading port 206. A plurality of lift pins 207 is installed in the bottom of the lower container 202b.

A substrate mounting member 210 for supporting the wafer 100 is installed in the processing chamber 201. The substrate mounting member 210 includes a substrate mounting table 212 with a mounting surface 211 on which the wafer 100 is mounted. Further, a heater 213 as a heating part is installed. The heating part is used to heat the wafer 100 so that the quality of a film formed on the wafer 100 can be improved.

The substrate mounting table 212 is supported by a shaft 217. The shaft 217 penetrates through the bottom of the processing container 202 and is connected to an elevating instrument 218 outside the processing container 202. The elevating instrument 218 is operated to move up and down the shaft 217 and the substrate mounting table 212 so that the wafer 100 mounted on the substrate mounting surface 211 can be moved up and down. In addition, the periphery of the lower end portion of the shaft 217 is covered with a bellows 219 to keep the interior of the processing chamber 201 airtight.

When the wafer 100 is transferred, the substrate mounting table 212 is moved down such that the mounting surface 211 is at the position of the substrate loading/unloading port 206 (a wafer transfer position). When the wafer 100 is processed, the substrate mounting table 212 is moved up such that the wafer 100 is moved up to a processing position in the processing chamber 201 (a wafer processing position).

The heater 213 is configured to individually control heating of the central plane and outer peripheral plane of the wafer 100. For example, the heater 213 includes a center zone heater 213a which is installed in the center of the substrate mounting surface 211 and has a circumferential shape when viewed from above, and an outer zone heater 213b which has the same circumferential shape and is installed in the outer periphery of the center zone heater 213a. The center zone heater 213a heats the central plane of the wafer and the outer zone heater 213b heats the outer peripheral plane of the wafer.

The center zone heater 213a and the outer zone heater 213b are connected to a heater temperature control part 215 via heater power supply lines, respectively. The heater temperature control part 215 controls the supply of power to each of the heaters 213a and 213b to thereby control the temperatures of the central plane and outer peripheral plane of the wafer 100.

On the substrate mounting table 212 are installed a temperature measuring device 216a and a temperature measuring device 216b for measuring the temperature of the wafer 100. The temperature measuring device 216a is installed at the central portion of the substrate mounting table 212 so as to measure the temperature in the vicinity of the center zone heater 213a. The temperature measuring device 216b is installed in the outer peripheral surface of the substrate mounting table 212 so as to measure the temperature in the vicinity of the outer zone heater 213b. The temperature measuring device 216a and the temperature measuring device 216b are electrically connected to a temperature information receiving part 216c. A voltage and a current generated by each of the temperature measuring devices 216a and 216b are measured as temperature information by the temperature information receiving part 216c. The temperature information is transmitted from the temperature information receiving part 216c to the controller 280 to be described later. The controller 280 controls the heater temperature based on the received temperature information and information received from the host device 270. The temperature measuring device 216a, the temperature measuring device 216b and the temperature information receiving part 216c are collectively referred to as a temperature detecting pan 216.

(Exhaust System)

On the upper surface of the inner wall of the processing chamber 201 (the upper container 202a) is installed an exhaust port 221 for exhausting the atmosphere of the processing chamber 201. An exhaust pipe 224 is connected to the exhaust port 221. A pressure regulator 222 such as an APC (Auto Pressure Controller) for controlling the interior of the processing chamber 201 to a predetermined pressure and a vacuum pump 223 are connected in series to the exhaust pipe 224. A first exhaust part (exhaust line) is mainly constituted by the exhaust port 221, the exhaust pipe 224 and the pressure regulator 222. The vacuum pump 223 may be included in the first exhaust part.

(Buffer Chamber)

Above the processing chamber 201 is installed a buffer chamber 232. The buffer chamber 232 is constituted by a side wall 232a and a ceiling 232b. The buffer chamber 232 includes therein a shower head 234. A gas supply path 235 is formed between the side wall 232a of the buffer chamber 232 and the shower head 234. That is, the gas supply path 235 is formed so as to surround the outer wall 234b of the shower head 234.

Figure 9:
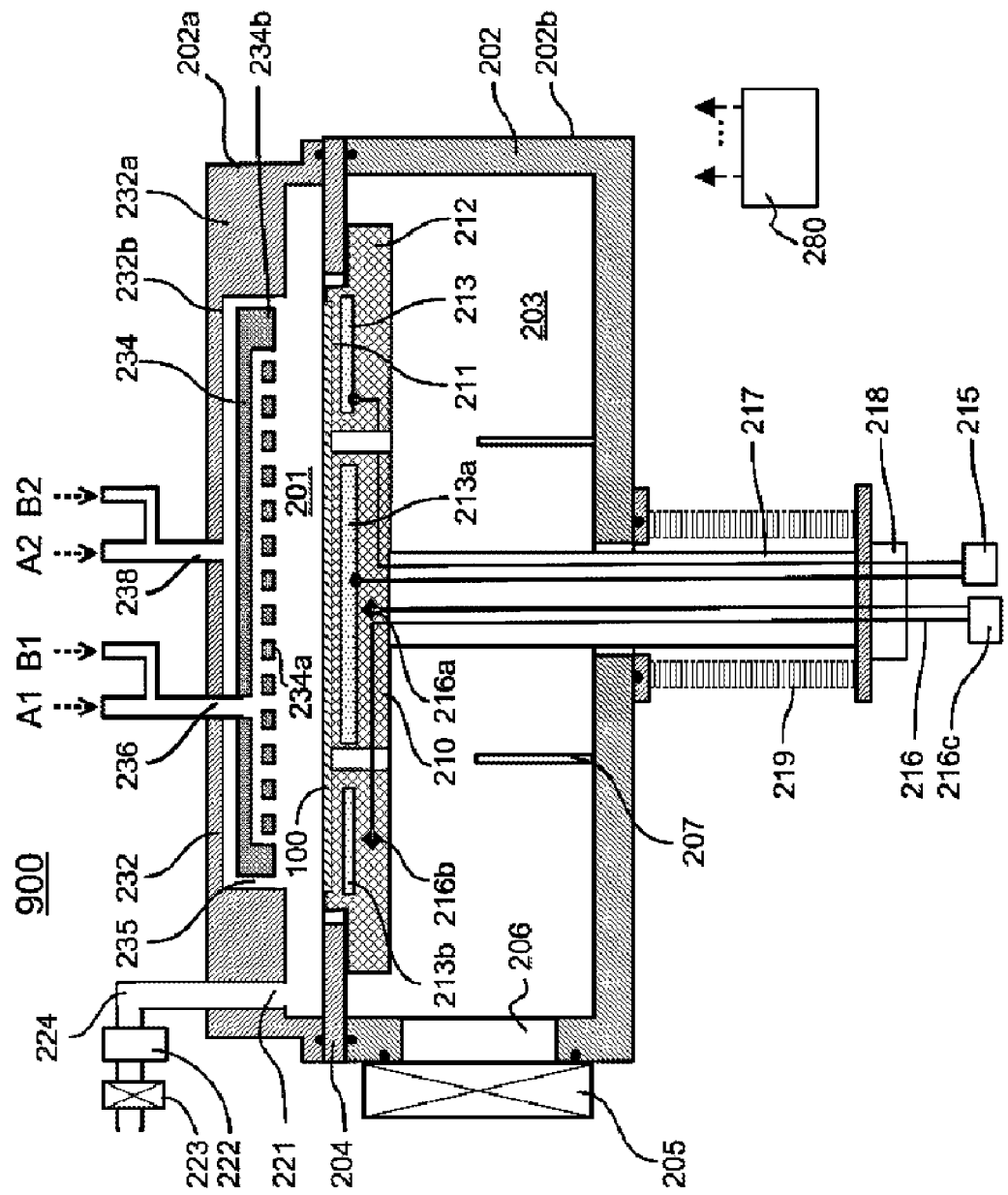
FIG. 9 is an explanatory view for explaining a substrate processing apparatus according to the first embodiment.
Figure 10:
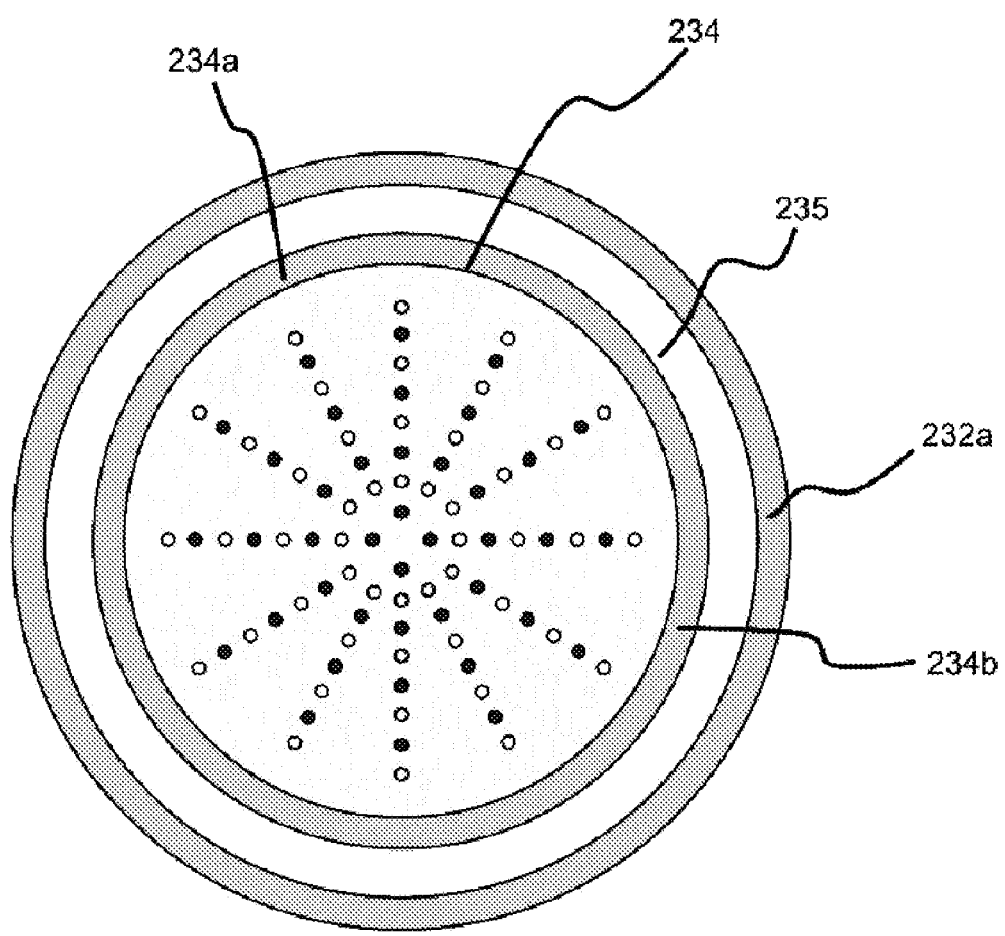
FIG. 10 is an explanatory view for explaining the substrate processing apparatus according to the first embodiment.

A dispersion plate 234a is installed in a wall partitioning the shower head 234 and the processing chamber 201. The dispersion plate 234a has, for example, a disc shape. When viewed from the processing chamber 201 side, as shown in FIG. 9, the gas supply path 235 is formed between the shower head side wall 234b and the side wall 232a around the horizontal direction of the dispersion plate 234a.

A gas introduction pipe 236 penetrates through the ceiling 232b of the buffer chamber 232. Further, a gas introduction pipe 238 is connected to the ceiling 232b. The gas introduction pipe 236 is connected to the shower head 234. The gas introduction pipe 236 and the gas introduction pipe 238 are connected to a gas supply part to be described later.

A gas introduced from the gas introduction pipe 236 is supplied into the processing chamber 201 via the shower head 234. A gas introduced from the gas introduction pipe 238 is supplied into the processing chamber 201 via the gas supply path 235.

The gas supplied from the shower head 234 is supplied to the center of the wafer 100. The gas supplied from the gas supply path 235 is supplied to the edge of the wafer 100. The outer peripheral plane (edge) of the wafer refers to the outer periphery of the wafer with respect to the above-mentioned wafer center.

(First Gas Supply Part)

Figure 11:
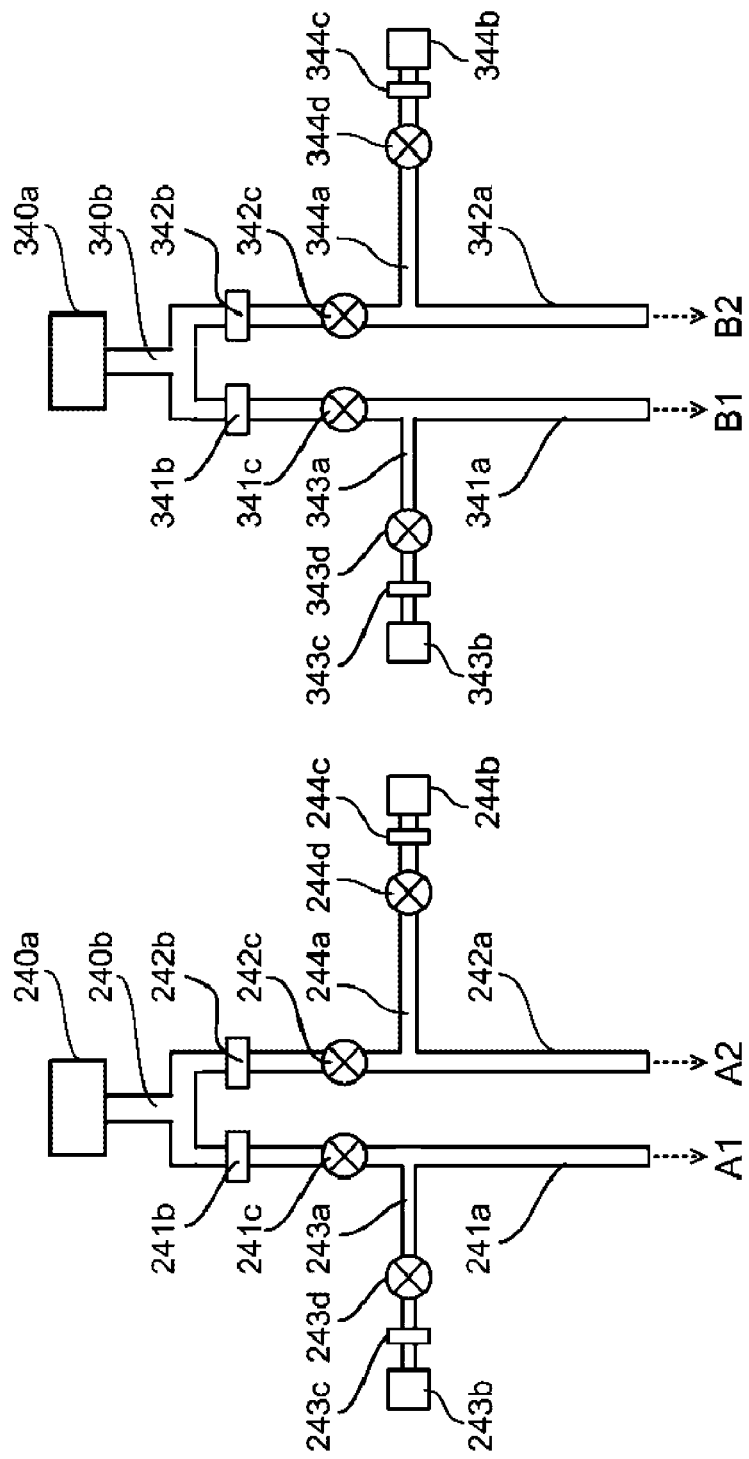
FIG. 11 is an explanatory view for explaining the substrate processing apparatus according to the first embodiment.

Subsequently, a first gas supply part will be described with reference to FIG. 11. A1 in FIG. 11 is connected to A1 in FIG. 9, and A2 in FIG. 11i is connected to A2 in FIG. 9. That is, a gas supply pipe 241a is connected to the gas introduction pipe 236, and a gas supply pipe 242a is connected to the gas introduction pipe 238.

In the gas supply pipe 241a are installed a confluent pipe 240b, a mass flow controller (MFC) 241b and a valve 241c from the upstream. A flow rate of gas passing through the gas supply pipe 241a is controlled by the MFC 241b and the valve 241c. A gas source 240a of a first processing gas is installed in the upstream of the confluent pipe 240b.

The first processing gas is one of precursor gases, that is, processing gases. The first processing gas contains a first element.

In this embodiment, the first element is, for example, silicon (Si). That is, the first processing gas is, for example, a first silicon-containing gas. As the first silicon-containing gas, there may be possible to use, e.g., a halosilane gas. Halosilane refers to silane having a halogen group. The halogen group includes a chloro group, a fluoro group, a bromo group, an iodo group and the like. That is, the halogen group includes halogen elements such as chlorine (Cl), fluorine (F), bromine (Br), iodine (I) and the like. In this embodiment, particularly, the halosilane gas is a dichlorosilane ($SiH_2Cl_2$, abbreviation: DCS) gas or alternatively, an aminosilane gas. In this embodiment, specifically, the aminosilane (AS) gas includes the followings: a butylaminosilane (BAS) gas, a bistert-butylaminosilane (BTBAS) gas, a dimethylaminosilane (DMAS) gas, a bisdimethylaminosilane (BDMAS) gas, a trisdimethylaminosilane (3DMAS) gas, a diethylaminosilane (DEAS) gas, a bisdiethylaminosilane (BDEAS) gas, a dipropylaminosilane (DPAS) gas, a diisopropylaminosilane (DIPAS) gas and the like. The precursor of the first processing gas may be any of a solid, a liquid and a gas at the room temperature and pressure. When the precursor of the first processing gas is a liquid at the room temperature and pressure, a vaporizer (not shown) may be installed between the gas source 240a and the MFC 241b. In this embodiment, the precursor will be described as a gas.

A first inert gas supply pipe 243a for supplying an inert gas may be connected to the downstream side of the valve 241c. In the first inert gas supply pipe 243a are installed an inert gas source 243b, an MFC 243c and a valve 243d from the upstream. For example, a helium (He) gas is used as the inert gas. The inert gas is added to a gas flowing through the gas supply pipe 241a and is used as a dilution gas. By controlling the MFC 243c and the valve 243d, it is possible to more optimally tune the concentration and flow rate of the processing gas supplied through the gas introduction pipe 236 and the shower head 234.

In the gas supply pipe 242a connected to the gas introduction pipe 238 are installed the confluent pipe 240b, a mass flow controller (MFC) 242b and a valve 242c from the upstream. A flow rate of gas passing through the gas supply pipe 242a is controlled by the MFC 242b and the valve 242c. The gas source 240a of the first processing gas is installed in the upstream of the confluent pipe 240b.

A second inert gas supply pipe 244a for supplying an inert gas may be connected to the downstream side of the valve 242c. In the inert gas supply pipe 244a are installed an inert gas source 244b, an MFC 244c and a valve 244d from the upstream. For example, a helium (He) gas is used as the inert gas. The inert gas is added to a gas flowing through the gas supply pipe 242a and is used as a dilution gas. By controlling the MFC 244c and the valve 244d, it is possible to more optimally tune the concentration and flow rate of the gas flowing through the gas introduction pipe 238 and the gas supply path 235.

The gas supply pipe 241a, the MFC 241b, the valve 241c, the gas supply pipe 242a, the MFC 242b, the valve 242c and the confluent pipe 240b are collectively referred to as a first gas supply part. The gas source 240a, the gas introduction pipe 236 and the gas introduction pipe 238 may be included in the first gas supply part.

The first inert gas supply pipe 243a, the MFC 243c, the valve 243d, the second inert gas supply pipe 244a, the MFC 244c, and the valve 244d are collectively referred to as a first inert gas supply part. The inert gas source 243b and the inert gas source 244b may be included in the first inert gas supply part. Further, the first inert gas supply part may be included in the first gas supply part.

As described above, since the MFCs and the valves are installed in the first gas supply part, the amount of gas can be individually controlled. Further, since the MFCs and the valves are installed in the first inert gas supply part, the gas concentration can be individually controlled.

(Second Gas Supply Part)

Subsequently, a second gas supply part will be described with reference to FIG. 11. B1 in FIG. 11 is connected to B1 in FIG. 9, and B2 in FIG. 11 is connected to B2 in FIG. 9. That is, a gas supply pipe 341a is connected to the gas introduction pipe 236, and a gas supply pipe 342a is connected to the gas introduction pipe 238.

In the gas supply pipe 341a are installed a confluent pipe 340b, an MFC 341b and a valve 341c from the upstream. A flow rate of gas passing through the gas supply pipe 341a is controlled by the MFC 341b and the valve 341c. A gas source 340a of a second processing gas is installed in the upstream of the confluent pipe 340b.

The second processing gas is one of precursor gases, that is, processing gases. The second processing gas contains a second element.

In this embodiment, the second element is, for example, silicon (Si). That is, the second processing gas is, for example, a second silicon-containing gas. The second silicon-containing gas is a silane-based gas, for example, a disilane gas (($Si_2H_6$), abbreviation: DS) gas. Without being limited to $Si_2H_6$, the second processing gas may be a compound of silicon and hydrogen. Examples thereof may include a monosilane ($SiH_4$) gas, a trisilane ($Si_3H_8$) gas, a tetrasilane ($Si_4H_{10}$) gas, a pentasilane ($Si_5H_{12}$) gas, a hexasilane ($Si_6H_{14}$), gas and the like. The precursor of the second processing gas may be any of a solid, a liquid and a gas at the room temperature and pressure. When the precursor of the second processing gas is a liquid at the room temperature and pressure, a vaporizer (not shown) may be installed between the gas source 340a and the MFC 341b. In this embodiment, the precursor will be described as a gas.

A third inert gas supply pipe 343a for supplying an inert gas may be connected to the downstream side of the valve 341c. In the inert gas supply pipe 343a are installed an inert gas source 343b, an MFC 343c and a valve 343d from the upstream. For example, a helium (He) gas is used as the inert gas. The inert gas is added to a gas flowing through the gas supply pipe 341a and is used as a dilution gas. By controlling the MFC 343c and the valve 343d, it is possible to more optimally tune the concentration and flow rate of the processing gas supplied via the gas introduction pipe 236 and the shower head 234.

In the gas supply pipe 342a connected to the gas introduction pipe 238 are installed the confluent pipe 340b, an MFC 342b and a valve 342c from the upstream. A flow rate of gas passing through the gas supply pipe 342a is controlled by the MFC 342b and the valve 342c. The gas source 340a of the second processing gas is installed in the upstream of the confluent pipe 340b.

A fourth inert gas supply pipe 344a for supplying an inert gas may be connected to the downstream side of the valve 342c. In the fourth inert gas supply pipe 344a are installed an inert gas source 344b, an MFC 344c and a valve 344d from the upstream. For example, a helium (He) gas is used as the inert gas. The inert gas is added to a gas flowing through the gas supply pipe 342a and is used as a dilution gas. By controlling the MFC 344c and the valve 344d, it is possible to more optimally tune the concentration and flow rate of the gas flowing through the gas introduction pipe 238 and the gas supply path 235.

The gas supply pipe 341a, the MFC 341b, the valve 341c, the gas supply pipe 342a, the MFC 342b, the valve 342c and the confluent pipe 340b are collectively referred to as a second gas supply part. The gas source 340a, the gas introduction pipe 236 and the gas introduction pipe 238 may be included in the second gas supply part.

The third inert gas supply pipe 343a, the MFC 343c, the valve 343d, the fourth inert gas supply pipe 344a, the MFC 344c and the valve 344d are collectively referred to as a second inert gas supply part. The inert gas source 343b and the inert gas source 344b may be included in the second inert gas supply part. Further, the second inert gas supply part may be included in the second gas supply part.

As described above, since the MFCs and the valves are installed in the second gas supply part, the amount of gas can be individually controlled. Further, since the MFCs and the valves are installed in the second inert gas supply part, the concentration of the gas can be individually controlled.

(Control Part)

The substrate processing apparatus 900 includes a controller 280 that controls the operation of various parts of the substrate processing apparatus 900.

Figure 12:
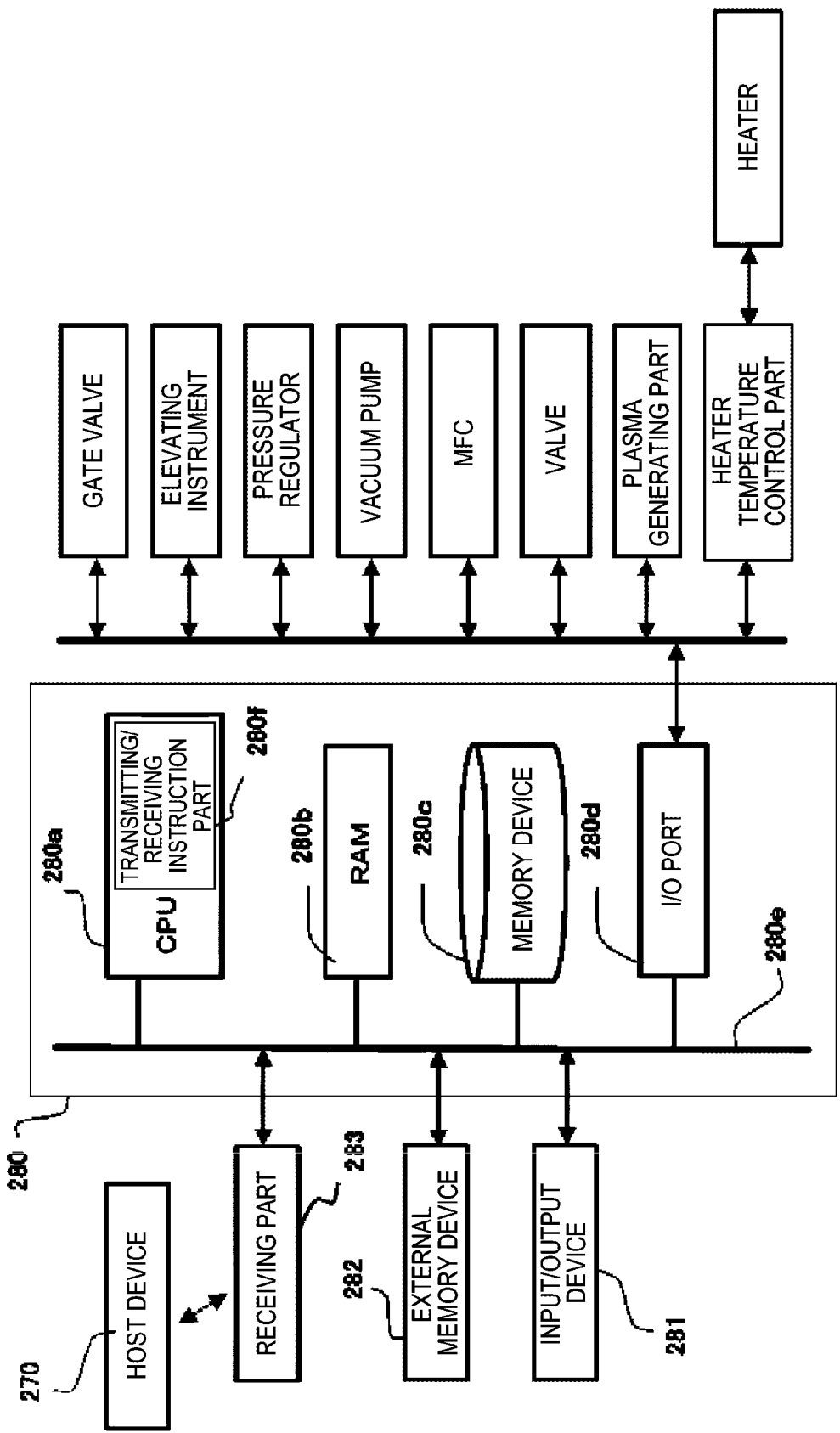
FIG. 12 is an explanatory view for explaining the substrate processing apparatus according to the first embodiment.

The outline of the controller 280 is shown in FIG. 12. The controller 280, which is a control part (control unit), is configured as a computer including a CPU (Central Processing Unit) 280a, a RAM (Random Access Memory) 280b, a memory device 280c and an I/O port 280d. The RAM 280b, the memory device 280c and the I/O port 280d are configured to exchange data with the CPU 280a via an internal bus 280e. The CPU 280a includes a transmitting/receiving instruction part 280f which instructs transmission/reception of information between the respective components. An input/output device 281 constituted by, for example, a touch panel or the like, and an external memory device 282 may be connected to the controller 280. Further, a receiving part 283 connected to the host device 270 via a network is installed. The receiving part 283 can receive information of another device from the host device 270.

The memory device 280c is configured with, for example, a flash memory, a hard disk drive (HDD) or the like. A control program for controlling operations of a substrate processing apparatus and a program recipe, in which sequences and conditions of a substrate processing process to be described later are written, are readably stored in the memory device 280c. A process recipe functions as a program for causing the controller 280 to execute each sequence in the substrate processing process, which will be described later, to obtain a predetermined result. Hereinafter, the program recipe, the process recipe and the control program will be generally and simply referred to as a "program". When the term "program" is used herein, it may indicate a case of including only the program recipe, a case of including only the control program, or a case of including both the program recipe and the control program. In addition, the RAM 280b is configured as a memory area (work area) in which a program or data read by the CPU 280a is temporarily stored.

The I/O port 280d is connected to the gate valve, the elevating instrument, the heater, the pressure regulator, the vacuum pump and the like. It may also be connected to each MFC, each valve, etc.

The CPU 280a is configured to read and execute the control program from the memory device 280c. The CPU 280a also reads the process recipe from the memory device 280c according to an input of an operation command from the input/output device 281. In addition, the CPU 280a is configured to control the opening/closing operation of the gate valve, the moving up/down operation of the elevating instrument, the operation of supplying of power to the heater, the pressure adjusting operation of the pressure regulator, the on/off control of the vacuum pump, the flow rate adjusting operation of the mass flow controllers, the valves and so on, according to the contents of the read process recipe.

The controller 280 may be configured by a general-purpose computer as well as a dedicated computer. For example, the controller 280 of this embodiment may be configured by installing, on the general-purpose computer, the aforementioned program stored in the external memory device 282 (for example, a magnetic tape, a magnetic disc such as a flexible disc or a hard disc, an optical disc such as a CD or DVD, a magneto-optical disc such as an MO, a semiconductor memory such as a USB memory or a memory card). However, the program may be supplied to the computer using communication means such as the Internet or a dedicated line, instead of using the external memory device 282. The memory device 280c or the external memory device 282 is configured as a computer-readable recording medium. Hereinafter, the memory device 280c and the external memory device 282 will be generally and simply referred to as a "recording medium." When the term "recording medium" is used herein, it may indicate a case of including only the memory device 280c, a case of including only the external memory device 282, or a case of including both the memory device 280c and the external memory device 282.

In addition, it has been illustrated that the receiving part of this embodiment receives information of another device from the host device 270, but the present disclosure is not limited thereto. For example, information may be directly received from another device. Specifically, information may be directly received from a device that measures the hole diameter. In addition, information on another device may be input by the input/output device 281 and may be controlled based on the information. Further, information of another device may be stored in and received from the external memory device.

Subsequently, a process of correcting the channel film 109 using the substrate processing apparatus 900 will be described with reference to FIGS. 4 and 13. In the following description, the operation of various parts constituting the substrate processing apparatus is controlled by the controller 280.

(Second Channel Forming Step S207)

Figure 8A:
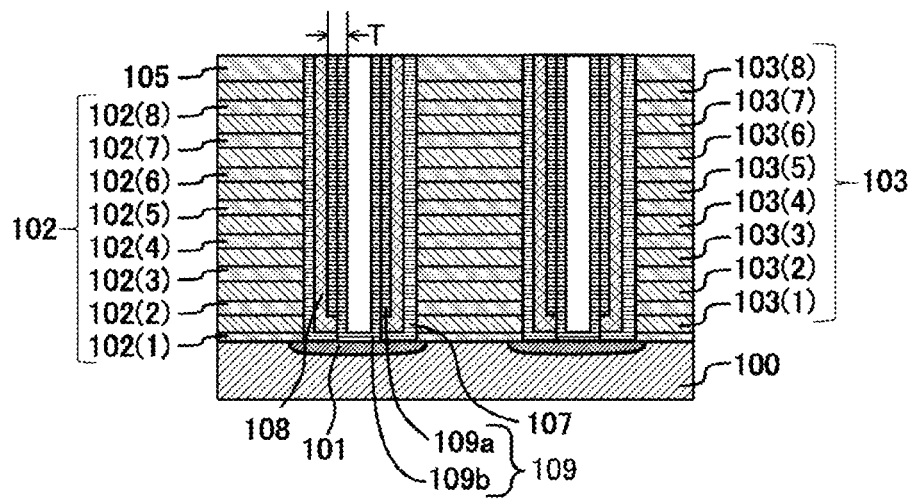
FIGS. 8A and 8B are explanatory views for explaining a state of processing a wafer according to the first embodiment.
Figure 8B:
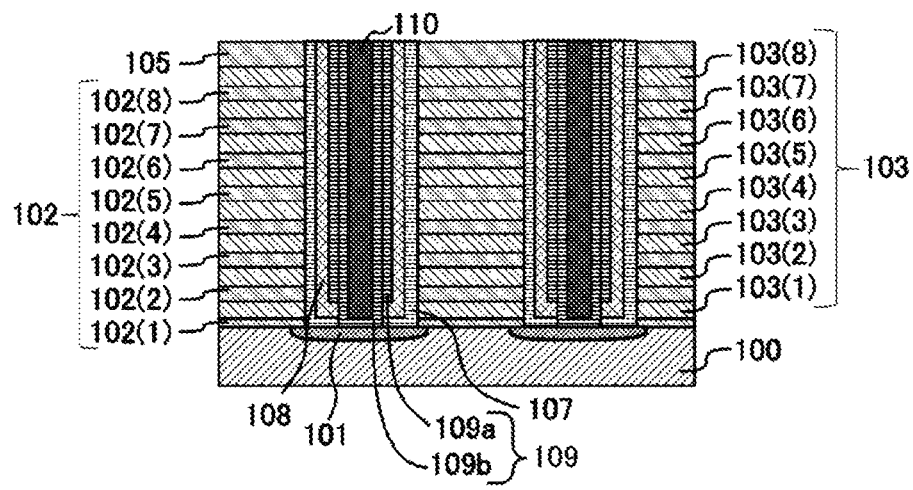

A second channel forming step S207 will be described with reference to FIGS. 8A, 8B and 13.

(Substrate Loading Step S401)

After the distribution of hole diameter R of the channel hole 106 is measured in the hole diameter measuring step S205, the wafer 100 having the in-plane distribution of hole diameter is loaded into the substrate processing apparatus 900.

(Decompressing/Heating Step 402)

Subsequently, the interior of the processing chamber 201 is exhausted through the exhaust pipe 224 so that the interior of the processing chamber 201 has a predetermined pressure (degree of vacuum). At this time, based on a temperature value detected by the temperature detecting part 216, the amount of current to the heater 213 is feedback-controlled so that the interior of the processing chamber 201 has a predetermined temperature. Specifically, the substrate mounting member 210 is heated in advance by the heater 213 and is left alone for a predetermined time after a change in temperature of the wafer 100 or the substrate mounting member 210 disappears.

After the wafer 100 is mounted on the substrate mounting member 210 and the internal atmosphere of the processing chamber 201 is stabilized, the MFCs 241b and 242b are operated and the opening degrees of the valves 241c and 242c are adjusted. At this time, the MFCs 243c and 244c may be operated and the opening degrees of the valves 243d and 244d may be adjusted.

(Gas Supplying Step S401)

A gas supplying step includes a first gas supplying step S403, a first purging step S404, a second gas supplying step S405 and a second purging step S406 which are performed a predetermined number of times.

When supplying a gas, the MFCs and the valves of the gas supply part are controlled according to the hole diameter distribution data received by the receiving part 283 to thereby control the amount (or concentration) of processing gas to be supplied to the central plane of the wafer 100 and the amount (or concentration) of processing gas to be supplied to the peripheral plane thereof. More specifically, the center zone heater 213a and the outer zone heater 213b are controlled to control an in-plane temperature distribution of the wafer 100 according to the measurement data received from the host device 270.

(First Gas Supplying Step S403)

In the first gas supplying step S403, a halosilane gas as a first gas (processing gas) is supplied from the first gas supply part into the processing chamber 201. Specifically, a flow rate of halosilane gas supplied from the first gas supply source 113 is regulated by the MFC 115 and then is supplied into the substrate processing apparatus 900. The halosilane gas with the adjusted flow rate is supplied through the buffer chamber 232 from gas supply holes of the dispersion plate 234a into the first processing chamber 201a in a reduced pressure state. In addition, the exhaust of the interior of the processing chamber 201 by the exhaust system is continued such that the internal pressure of the first processing chamber 201a falls within a predetermined pressure range (first pressure). At this time, the halosilane gas is supplied to the wafer 100. The halosilane gas is supplied into the first processing chamber 201a at a predetermined pressure (the first pressure: for example, 10 Pa to 1,000 Pa). In this way, halosilane gas is supplied to the wafer 100. By supplying the halosilane gas, a silicon-containing layer is formed on the wafer 100.

Here, when a surface on which CSL is exposed is a single crystal, the following phenomenon occurs. A halogen having high electronegativity can break a Si—O bond in a natural oxide film formed on the surface of the single crystal. Thereby, an atomic bonding of Si on the surface of the single crystal becomes free. That is, a dangling bond of a Si covalent bond may be generated on the surface of the single crystal Si. Thus, it is possible to generate an environment in which homoepitaxial growth can be easily progressed.

(First Purging Step S404)

After the silicon-containing layer is formed on the wafer 100, the valve 241c of the gas supply pipe 241a is closed to stop the supply of halosilane gas. By stopping the supply of first gas, the first gas present in the processing chamber 201 and the processing gas present in the buffer chamber 232 are exhausted from the first exhaust part to perform the first purging step S404.

In addition, in the first purging step S404, in addition to discharging the gas simply by exhausting (evacuating) the interior of the processing chamber 201, an inert gas may be supplied from the inert gas source 243b to discharge the remaining gas. In this case, the valve 243d is opened and a flow rate of the inert gas is adjusted by the MFC 243c. In addition, the evacuation and the supply of inert gas may be performed in combination. Further, it is also possible to alternately perform the evacuation and the supply of inert gas.

After the lapse of a predetermined time, the valve 243d is closed to stop the supply of inert gas. The supply of inert gas may be continued with the valve 243d opened.

The temperature of the heater 213 at this time is set to be the same temperature as when the first gas is supplied to the wafer 100. A supply flow rate of $N_2$ gas as a purge gas supplied from the inert gas supply system is set to fall within a range of, e.g., 100 to 20,000 sccm. As the purge gas, in addition to the $N_2$ gas, there may be possible to use a rare gas such as Ar, He, Ne, Xe or the like.

(Second Gas Supplying Step S405)

After the first purging step S404, a DS gas as a second gas (processing gas) is supplied from the second gas supply part into the first processing chamber 201a. Specifically, the valve 126 is opened to supply the DS gas into the first processing chamber 201a via the gas introduction port 241, the buffer chamber 232 and the plurality of holes of the dispersion plate 234a.

At this time, the MFC 125 is adjusted such that the DS gas has a predetermined flow rate. The supply flow rate of DS gas is, for example, 1 sccm or more and 10,000 sccm or less.

When the DS gas is supplied to the silicon-containing layer formed on the wafer 100, the silicon-containing layer is modified to form a Si layer having a predetermined thickness. The Si layer is formed to have a predetermined thickness and a predetermined distribution according to, for example, the internal pressure of the first processing chamber 201*a*, the flow rate of DS gas, the temperature of the wafer 100, and the like.

For example, hydrogen (H) in the DS gas can be used to form a film of Si alone by removing a halogen element, an oxygen element, an amine (NH) component and the like contained in the silicon-containing layer. Here, the halogen element, the oxygen element and the amine component are generated from at least one of a component contained in the first processing gas, oxygen attached to the wafer 100, a natural oxide film and a substance adhered at a cleaning step.

After the lapse of a predetermined time, the valve 126 is closed to stop the supply of DS gas.

The temperature of the heater 213 at this time is set to be the same temperature as when the first gas is supplied to the wafer 100.

(Second Purging Step S406)

The second purging step S406 is performed in the same operation as the first purging step S404. For example, the second purging step S406 is performed when the DS gas existing in the processing chamber 201 and the DS gas existing in the buffer chamber 232 are exhausted from the first exhaust part by stopping the supply of DS gas. The purging may also be performed by supplying a purge gas into the buffer chamber 232 and the processing chamber 201.

(Determining Step S407)

After completion of the second purging step S406, the controller 280 determines whether or not the above-described film forming step S401 (S403 to S406) has been performed by a predetermined cycle number n. That is, it is determined whether or not the second channel film 109*b* having a desired thickness has been formed on the wafer 100. With the above-described steps S403 to S406 as one cycle, by performing this cycle at least once, it is possible to form the second channel film 109*b* having a predetermined film thickness on the wafer 100. The above cycle may be repeated a plurality of times. As a result, as shown in FIG. 8A, the second channel film 109*b* having the predetermined film thickness is formed on the wafer 100 (the inner wall of the channel hole 106 where the CSL is exposed).

In the determining step S407, when the gas supplying step S401 is not performed a predetermined number of times (No in the step S407), the cycle of the gas supplying step S401 is repeated. When the gas supplying step S401 is performed a predetermined number of times (Yes in the step S407), the gas supplying step S401 is ended and a second processing step S302 is performed.

(Transfer Pressure Adjusting Step S408)

After the determining step S407, in a transfer pressure adjusting step S408, the interior of the processing chamber 201 and the transfer chamber 203 are set at a predetermined pressure (degree of vacuum). The lift pins 207 may hold the temperature of the wafer 100 so as to cool the wafer 100 to a predetermined temperature during, before or after the transfer pressure adjusting step S408.

(Substrate Unloading Step S409)

After the interior of the processing chamber 201 reaches a predetermined pressure in the transfer pressure adjusting step S408, the gate valve 205 is opened and the wafer 100 is unloaded from the transfer chamber 203 to the vacuum transfer chamber (not shown).

Subsequently, a method of controlling a film thickness distribution of the second channel film 109*b* using the present apparatus will be described. As described above, the hole diameter of the channel hole 106 in which the second channel film 109*b* is formed is different between the center side and the outer circumference side of the wafer 100. In the hole diameter measuring step S205, the first channel film 109*a* is formed, and the distribution of hole diameter of the channel hole 106 after etching is measured. The measurement results are stored in the RAM 280*b* through the host device 270. The stored data are compared with the recipe in the memory device 280*c* to calculate a recipe to be used to form the second channel film 109*b*. Based on the calculated recipe, device control is performed to adjust (tune) the film thickness distribution of the second channel film 109.

Next, a case where the data stored in the RAM 280*b* is the distribution B will be described.

The distribution B indicates that the hole diameter of the channel hole 106 is smaller at the center side and larger at the outer circumference side. In the case of the distribution B, in the present step, the film thickness of the second channel film 109*b* formed on the outer peripheral side of the wafer 100 is decreased and the film thickness of the second channel film 109*b* formed on the center side of the wafer 100 is made larger than that on the outer peripheral side. Specifically, when supplying a gas, the amount of silicon-containing gas to be supplied to the outer peripheral side of the wafer 100 is controlled to be smaller than that on the center side of the wafer 100. In this way, the film thickness of the second channel film 109*b* in the present semiconductor device can be set to fall within a predetermined range within the plane of the wafer 100. In other words, the film thickness of the channel film 109 can be aligned on the center side and the outer peripheral side.

At this time, the gas supply part controls the MFCs 241*b* and 341 *b* and the opening degree of the valves 241*c* and 341*c* to control the amount of silicon-containing gas to be supplied from the shower head 234 to the processing chamber 201. Further, it controls the MFCs 242*b* and 342*b* and the opening degree of the valves 242*c* and 342*c* to supply the silicon-containing gas from the gas supply path 235 to the processing chamber 201. The MFCs and the valves of the first gas supply part and the MFCs and the valves of the second gas supply part may be configured with different settings.

The amount of exposure of the silicon-containing gas per unit area on the processing surface of the wafer 100 is controlled such that the amount of exposure of a gas supplied from the gas supply path 235 is smaller than the amount of exposure of a gas supplied from the shower head 234. The exposure amount used herein refers to the exposure amount of a main component of processing gas. In this embodiment, the processing gas is a silicon-containing gas consisting mainly of silicon.

The silicon-containing gas supplied through the shower head 234 is supplied to the center side of the wafer 100. The supplied gas is used to form the second channel film 109*b* on the center side of the wafer 100.

The silicon-containing gas supplied through the gas supply path 235 is supplied to the outer peripheral side of the wafer 100. The supplied gas is used to form the second channel film 109*b* on the outer peripheral side of the wafer 100.

As described above, since the exposure amount of silicon-containing gas per unit area on the processing surface of the wafer 100 is larger at the center side than at the outer peripheral side, it is possible to make the film thickness of the second channel film 109b at the center side larger than the film thickness of the second channel film 109b at the peripheral side.

In this manner, the film thickness of the channel film 109 is corrected.

As an alternative, the supply amounts of silicon-containing gas of the gas supply pipes 241a and 341a and the gas supply pipes 242a and 342a may be set to be the same, and instead, the concentrations of silicon-containing gas of the gas supply pipes 241a and 341a and the gas supply pipes 242a and 342a may be controlled. When controlling the concentrations of silicon-containing gas, the concentrations of silicon-containing gas passing through the gas supply pipes 241a and 341a and the gas supply pipes 242a and 342a are controlled by controlling the first inert gas supply part and the second inert gas supply part. In the case of the distribution B, the concentration of silicon-containing gas passing through the gas supply pipes 241a and 341a is increased and the concentration of silicon-containing gas passing through the gas supply pipes 242a and 342a is set to be lower than that of the gas passing through the gas supply pipes 241a and 341a.

By doing so, the exposure amount of silicon-containing gas per unit area on the processing surface of the wafer 100 can be more closely controlled such that the amount of gas supplied from the gas supply path 235 is set to be smaller than the amount of gas supplied from the shower head 234. Such control makes it possible to make the film thickness of the second channel film 109b on the center side of the wafer 200 larger than that of the second channel film 109b on the outer peripheral side.

Further, the supply amounts of silicon-containing gas in the gas supply pipes 241a and 341a and the gas supply pipes 242a and 342a may be made different from each other, and the concentrations thereof may also be made different from each other. Such control makes it possible to supply the exposure amount of silicon-containing gas per unit area with a larger difference. That is, the second channel film 109b on the center side of the wafer 200 and the second channel film 109b on the outer peripheral side of the wafer 200 can have a larger width difference.

Further, the center zone heater 213a and the outer zone heater 213b may be controlled in parallel with controlling the processing gas as described above. Since the width of the formed second channel film 109b is proportional to the temperature, in the case of the distribution B, the temperature of the outer zone heater 213b is made lower than that of the center zone heater 213a. This is effective when a gas whose temperature condition contributes greatly to film formation efficiency is used to form the second channel film 109b.

In this way, when the processing gas supply amount (concentration) and the temperature are controlled in parallel, more precise film thickness control can be achieved.

In the case where the data stored in the RAM 280b is the distribution A, control reverse to that at the time of receiving the data of the distribution B may be performed. That is, the film thickness of the second channel film 109b formed on the center side of the wafer 100 may be smaller than the film thickness of the second channel film 109b formed on the outer peripheral side.

[S112]

Subsequently, the sacrificial film removing step S112 will be described with reference to FIG. 14A. In the sacrificial film removing step S112, the sacrificial film 103 is removed by wet etching. As a result of removal, a clearance 111(1) is formed at the position where the sacrificial film 103 is formed. Here, clearances 111(1), 111(2), . . . , 111(1), . . . , 111(8) are formed in order from the bottom.

[S114]

Subsequently, a conductive film forming step S114 will be described with reference to FIG. 14B. In the conductive film forming step S114, a conductive film 112 to be an electrode is formed in the clearance 111. The conductive film is made of, for example, tungsten or the like. Here, the conductive film 112 includes conductive films 112(1), 112(2), . . . , 112(o), . . . , 112(8) in order from the bottom.

Meanwhile, the present inventors have more carefully studied and found that a similar distribution occurs in the hole diameter of the channel hole 106 in the wafer after the hole forming step S106. Such variation in hole diameter occur, for example, during dry etching for forming the channel hole 106. The amount of etchant supplied into the plane of the wafer 100 and the amount of by-products discharged from the wafer 100 may be affected by warp of the wafer 100 during dry etching. The warp of the wafer 100 is generated by a stress of each of the insulating film 102 and the sacrificial film 103. Therefore, the warp of the wafer 100 increases with the increase in the number of laminated layers of the insulating film 102 and the sacrificial film 103.

The present inventors have found that the distribution of hole diameter occurred in the plane of the wafer 100 as described above affects the characteristics of a device formed on the wafer 100, which requires a step of correcting the hole diameter. When the hole diameters are different, for example, the surface area of the charge trapping film formed in a cylindrical shape changes, which may result in a change in amount of accumulated charges. For example, when the hole diameter is small, the area of the charge trapping film becomes small and the charge amount decreases. On the other hand, when the hole diameter is large, the area of the charge trapping film becomes large and the charge amount increases.

In addition, as shown in FIG. 6B, a distance D between the channel hole 106 and another channel hole 106 may be changed. When this distance D is changed, there arises a problem that variation occurs in a stress applied to the corresponding element.

As such a method of correcting the distribution of hole diameter, a hole measuring step S301 may be performed after the hole forming step S106, and the in-plane distribution data of the hole diameter obtained in the hole measuring step S301 are transmitted to an apparatus for forming the protective film 107 in order to adjust the in-plane distribution of the film thickness of the protective film 107. The apparatus for forming the protective film 107 may have the same configuration as those of FIGS. 9, 10, 11 and 12. When the protective film 107 is formed by the above-described apparatus, a gas to be supplied to each of the first gas supply part and the second gas supply part may be appropriately changed. The flow of the film forming process for correcting the in-plane distribution of the film thickness of the protective film 107 is the same as the flow shown in FIG. 13.

In a case where the protective film 107 is formed of, for example, an aluminum oxide (AlO) film, an aluminum-containing gas is used as the first gas and an oxygen-containing gas is used as the second gas. In this embodiment, the aluminum-containing gas is, for example, a trimethylaluminum (TMA) gas. Examples of the oxygen-containing gas may include an oxygen ($O_2$) gas, vapor ($H_2O$) and the like.

In a case where the protective film 107 is formed of, for example, a hafnium oxide (HfO) film, a hafnium-containing gas is used as the first gas and an oxygen-containing gas is used as the second gas. In this embodiment, the hafnium-containing gas is, for example, a triethylmethylaminohafnium (TEMAH) gas. The oxygen-containing gas is the same as described above.

Further, after performing the above-described corrected protective film forming step S201, the hole diameter measuring step S205 and the second channel film forming step S207 described above may be performed. In this way, by performing the correcting process a plurality of times, it is possible to reduce the in-plane distribution of the characteristics of a device formed on the wafer 100 and to improve the uniformity of the device characteristics.

The process of manufacturing a semiconductor device has been described in the above, but the embodiment of the present disclosure can be applied to processes other than the processing of manufacturing a semiconductor device, such as substrate processing processes including a liquid crystal device manufacturing process, a solar cell manufacturing process, a light emitting device manufacturing process, a glass substrate processing process, a ceramic substrate processing process, a conductive substrate processing process and the like.

According to the present disclosure in some embodiments, it is possible to provide a technique capable of forming a semiconductor device with good characteristics even in a flash memory having a three-dimensional structure.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a plurality of first channel holes in a laminated film including an insulating film and a sacrificial film on a substrate;
   forming a charge trapping film in each of the plurality of first channel holes and a first channel film on a surface of the charge trapping film in each of the plurality of first channel holes, thereby forming a plurality of second channel holes;
   receiving information on a distribution of hole diameters of the plurality of second channel holes; and
   forming a second channel film on a surface of the first channel film by supplying a first processing gas and a second processing gas different from the first processing gas to a center side and an outer peripheral side of the substrate, respectively, based on the received information, so as to create a substantively uniform distribution of the total thickness of the first channel film and the second channel film across the substrate of the semiconductor device.

2. The method of claim 1, wherein the act of forming the second channel film on the surface of the first channel film is performed such that an in-plane distribution of the sum of a side wall thickness of the second channel film and a side wall thickness of the first channel film falls within a predetermined range.

3. The method of claim 2, wherein before the charge trapping film and the first channel film are formed, the method further comprises:
   acquiring data of an in-plane distribution of hole diameters of the plurality of first channel holes; and
   forming a protective film on a surface of each of the plurality of first, channel holes based on the acquired data, so as to correct the in-plane distribution of the hole diameters of the plurality of first channel holes.

4. The method of claim 3, wherein the act of forming the second channel film on the surface of the first channel film includes using a first silicon-containing gas and a second silicon-containing gas and setting amounts of the first silicon-containing gas and the second silicon-containing gas supplied to the center side of the substrate to be different from amounts of the first silicon-containing gas and the second silicon-containing gas supplied to the outer peripheral side of the substrate.

5. The method of claim 2, wherein the act of forming the second channel film on the surface of the first channel film includes using a first silicon-containing gas and a second silicon-containing gas and setting amounts of the first silicon-containing gas and the second silicon-containing gas supplied to the center side of the substrate to be different from amounts of the first silicon-containing gas and the second silicon-containing gas supplied to the outer peripheral side of the substrate.

6. The method of claim 1, wherein before the charge trapping film and the first channel film are formed, the method further comprises:
   acquiring data of an in-plane distribution of hole diameters of the plurality of first channel holes; and
   forming a protective film on a surface of each of the plurality of first channel holes based on the acquired data, so as to correct the in-plane distribution of the hole diameters of the plurality of first channel holes.

7. The method of claim 6, wherein the act of forming the second channel film on the surface of the first channel film includes using a first silicon-containing gas and a second silicon-containing gas and setting amounts of the first silicon-containing gas and the second silicon-containing gas supplied to the center side of the substrate to be different from amounts of the first silicon-containing gas and the second silicon-containing gas supplied to the outer peripheral side of the substrate.

8. The method of claim 1, wherein the act of forming the second channel film on the surface of the first channel film includes using a first silicon-containing gas and a second silicon-containing gas and setting amounts of the first silicon-containing gas and the second silicon-containing gas supplied to the center side of the substrate to be different from amounts of the first silicon-containing gas and the second silicon-containing gas supplied to the outer peripheral side of the substrate.

* * * * *